(12) United States Patent
Choi et al.

(10) Patent No.: US 12,377,415 B2
(45) Date of Patent: Aug. 5, 2025

(54) PHOTOACTIVATED SELECTIVE RELEASE (PHASR) OF DROPLETS FROM MICROWELL ARRAYS

(71) Applicant: The Trustees of the University of Pennsylvania, Philadelphia, PA (US)

(72) Inventors: Yongwon Choi, Bryn Mawr, PA (US); Daeyeon Lee, Wynnewood, PA (US); Junhyong Kim, Narberth, PA (US); Syung Hun Han, Austin, TX (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 868 days.

(21) Appl. No.: 17/562,250

(22) Filed: Dec. 27, 2021

(65) Prior Publication Data

US 2022/0203370 A1     Jun. 30, 2022

Related U.S. Application Data

(60) Provisional application No. 63/132,270, filed on Dec. 30, 2020.

(51) Int. Cl.
*B01L 3/00* (2006.01)
*B81B 1/00* (2006.01)
(Continued)

(52) U.S. Cl.
CPC ........ *B01L 3/502784* (2013.01); *B81B 1/006* (2013.01); *G01N 15/1434* (2013.01);
(Continued)

(58) Field of Classification Search
CPC ....... B01L 2200/027; B01L 2200/0689; B01L 2300/046; B01L 2300/0663;
(Continued)

(56) References Cited

U.S. PATENT DOCUMENTS

| 6,734,436 B2 | 5/2004 | Faris et al. |
| 2009/0170186 A1* | 7/2009 | Wu ............... B01L 3/502761 435/286.1 |

(Continued)

FOREIGN PATENT DOCUMENTS

| CN | 103889556 A | 6/2014 |
| CN | 108603878 A | 9/2018 |

(Continued)

OTHER PUBLICATIONS

Agresti, et al., Ultrahigh-Throughput Screening in Drop-Based Microfluidics for Directed Evolution. Proc. Natl. Acad. Sci. U. S. A. 2010, 107 (9), 4004-4009. https://doi.org/10.1073/pnas.0910781107.

(Continued)

*Primary Examiner* — Jennifer Wecker
*Assistant Examiner* — Jonathan Bortoli
(74) *Attorney, Agent, or Firm* — BakerHostetler

(57) ABSTRACT

Provided is photoactivated selective release (or PHASR) of droplets from a microwell array enabled by a photoresponsive polymer layer integrated into the microfluidic device. This photoresponsive layer is placed in between a microwell array that traps a large number of droplets and a monolithic flow chamber that can be used for recovery. By using focused light, the photoresponsive layer can either be punctured or induced to create local heating to selectively release droplets. The type of photoacoustic dye and the physical properties of the photoresponsive layer can be engineered to induce either puncture of the membrane or pushing of droplets out of the microwells with low thermal impact on the droplets. This approach has broad application in the field of soft lithography-based microfluidic devices for various applications including photoresponsive valves as well as high throughput single cell sequencing.

19 Claims, 8 Drawing Sheets

(51) Int. Cl.
   *G01N 15/01* (2024.01)
   *G01N 15/1434* (2024.01)

(52) U.S. Cl.
   CPC . *B01L 2200/027* (2013.01); *B01L 2200/0689* (2013.01); *B01L 2300/0663* (2013.01); *B01L 2300/0829* (2013.01); *B01L 2300/1872* (2013.01); *B01L 2400/0442* (2013.01); *B81B 2201/057* (2013.01); *B81B 2203/033* (2013.01); *B81B 2203/0338* (2013.01); *G01N 15/01* (2024.01)

(58) Field of Classification Search
   CPC ..... B01L 2300/0829; B01L 2300/1872; B01L 2400/0442; B01L 3/502715; B01L 3/50273; B01L 3/502746; B01L 3/502784; B01L 3/50851; B81B 1/006; B81B 2201/057; B81B 2203/033; B81B 2203/0338; G01N 15/01; G01N 15/1434; G01N 15/1484; H01F 1/057; H01F 1/058
   See application file for complete search history.

(56) References Cited

U.S. PATENT DOCUMENTS

| | | |
|---|---|---|
| 2016/0008785 A1 | 1/2016 | Bergo |
| 2016/0257918 A1 | 9/2016 | Chapman et al. |
| 2017/0173580 A1* | 6/2017 | Lowe, Jr. ............ B01L 3/50273 |
| 2019/0046985 A1 | 2/2019 | Kang et al. |

FOREIGN PATENT DOCUMENTS

| | | |
|---|---|---|
| WO | 2017/218635 A2 | 12/2017 |
| WO | 2018/148271 A1 | 8/2018 |

OTHER PUBLICATIONS

Azhdarinia et al., Characterization of Chemical, Radiochemical and Optical Properties of a Dual-Labeled MMP-9 Targeting Peptide. Bioorg. Med. Chem. 2011, 19 (12), 3769-3776. https://doi.Org/10.1016/j.bmc.2011.04.054.

Csemica, et al., Effect of Plasticizers on the Properties of Polystyrene Films W. 1999, 76 (11), 9-11, https://doi.org/10.1021/ed076pl526.

Dittrich, et al., Lab-on-a-Chip: Microfluidics in Drug Discovery. Nat. Rev. Drug Discov. 2006, 5 (3), 210-218. https://doi.org/10.1038/nrdl985.

Fallah-Araghi, et al., Completely in Vitro Ultrahigh-Throughput Droplet-Based Microfluidic Screening System for Protein Engineering and Directed Evolution. Lab Chip 2012, 12 (5), 882-891. https://doi.org/10.1039/c21c21035e.

Guo, et al., Droplet Microfluidics for High-Throughput Biological Assays. Lab Chip 2012, 12 (12), 2146-2155. https://doi.org/10.1039/c21c21147e.

Han et al., "Photoactivated Selective Release of Droplets from Microwell Arrays," ACS Appl. Mater. Interfaces, vol. 12, Issue 3, 2020, pp. 3936-3944.

Han et al., "Static array of droplets and on-demand recovery for biological assays," Biomicrofluidics, vol. 14, 2020, 051302, pp. 7.

Huang, et al., Microfluidic Microwell Device for Immunomagnetic Single-Cell Trapping. Microfluid. Nanofluidics 2018, 22 (2), 16. https://doi.org/10.1007/s10404-018-2040-x.

Huebner, et al., Static Microdroplet Arrays: A Microfluidic Device for Droplet Trapping, Incubation and Release for Enzymatic and Cell-Based Assays. Lab Chip 2009, 9 (5), 692-698. https://doi.org/10.1039/b813709a.

Iwai, et al., A Resettable Dynamic Microarray Device, https://doi.org/10.1007/sl0544-011-9578-7.

Jeong, et al., A Highly Addressable Static Droplet Array Enabling Digital Control of a Single Droplet at PicoVolume Resolution. Lab Chip 2016, 16 (9), 1698-1707. https://doi.org/10.1039/C6LC00212A.

Jeong, et al., Moldable Perfluoropolyether-Polyethylene Glycol Networks with Tunable Wettability and Solvent Resistance for Rapid Prototyping of Droplet Microfluidics. Chem. Mater. 2018, 30 (8). https://doi.org/10.1021/acs.chemmater.7b05043.

Juul et al., Detection of Single Enzymatic Events in Rare or Single Cells Using Microfluidics. ACS Nano 2011, 5 (10), 8305-8310. https://doi.org/10.1021/nn203012q.

Kang, et al., Droplet Microfluidics for Single-Molecule and Single-Cell Analysis in Cancer Research, Diagnosis and Therapy. TrAC Trends Anal. Chem. 2014, 58, 145-153. https://doi.Org/10.1016/j.trac.2014.03.006.

Kim et al., From Chip-in-a-Lab to Lab-ona-Chip: Towards a Single Handheld Electronic System for Multiple Application-Specific Lab-on-a-Chip (ASLOC). 2014, 15, 2467. https://doi.org/10.1039/c41c01316f.

Kirchherr, et al., Stabilization of Indocyanine Green by Encapsulation within Micellar Systems. Mol. Pharm. 2009, 6 (2), 480-491. https://doi.org/10.1021/mp8001649.

Labanieh, et al., Floating Droplet Array: An Ultrahigh-Throughput Device for Droplet Trapping, Real-Time Analysis and Recovery. Micromachines 2015, 6 (10), 1469-1482. https://doi.org/10.3390/mi6101431.

Leung, et al., A Programmable Droplet-Based Microfluidic Device Applied to Multiparameter Analysis of Single Microbes and Microbial Communities. https://doi.Org/10.1073/pnas.1106752109/-/DCSupplemental.

Melin, et al., Microfluidic Large-Scale Integration: The Evolution of Design Rules for Biological Automation. Annu. Rev. Biophys. Biomol. Struct. 2007, 36 (1), 213-231. https://doi.org/10.1146/annurev.biophys.36.040306.132646.

Padmanabhan, et al., Controlled Droplet Discretization and Manipulation Using Membrane Displacement Traps. Lab Chip 2017, 17 (21), 3717-3724. https://doi.org/10.1039/C7LC00910K.

Park, et al., On-Demand Acoustic Droplet Splitting and Steering in a Disposable Microfluidic Chip. Lab Chip 2018, 18 (3), 422-432. https://doi.org/10.1039/c71c01083d.

Polystyrene https://polymerdatabase.com/polymers/polystyrene.html (accessed Jun. 6, 2019).

Pompano, et al., Microfluidics Using Spatially Defined Arrays of Droplets in One, Two, and Three Dimensions. Annu. Rev. Anal. Chem. 2011, 4 (1), 59-81. https://doi.org/10.1146/annurev.anchem.012809.102303.

Rambach, et al., Fast Selective Trapping and Release of Picoliter Droplets in a 3D Microfluidic PDMS Multi-Trap System with Bubbles. Analyst 2018, 143 (4), 843-849. https://doi.org/!0.1039/C7ANO11 OOH.

Rousset, et al., Simulation-Assisted Design of Microfluidic Sample Traps for Optimal Trapping and Culture ofNon-Adherent Single Cells , Tissues , and Spheroids. 2017, No. February, 1-12. https://doi.org/10.1038/s41598-017-00229-1.

Schmitz, et al., Dropspots: A Picoliter Array in a Microfluidic Device. Lab Chip 2009, 9(1), 44-49. https://doi.org/10.1039/B809670H.

Segaliny, et al., Functional TCR T Cell Screening Using Single-Cell Droplet Microfluidics. Lab Chip 2018, 18 (24), 3733-3749. https://doi.org/10.1039/C8LC00818C.

Sun, et al., Microfluidic Static Droplet Arrays with Tuneable Gradients in Material Composition. Lab Chip 2011, 11 (23), 3949. https://doi.org/10.1039/cllc20709a.

Tan, et al., A Trap-and-Release Integrated Microfluidic System for Dynamic Microarray Applications; 2007.

Utharala, et al., A Versatile, Low-Cost, Multiway Microfluidic Sorter for Droplets, Cells, and Embryos. 2018. https://doi.org/10.1021/acs.analchem.7b04689.

Venkatesh, et al., Patterning Polymer-Filled Nanoparticle Films via Leaching-Enabled Capillary Rise Infiltration (LeCaRI). Nanoscale Horizons 2019. https://doi.org/10.1039/c9nh00130a.

(56) References Cited

OTHER PUBLICATIONS

Wang, et al., A Microfluidic Cell Array with Individually Addressable Culture Chambers. Biosens. Bioelectron. 2008, 24 (4), 613-617. https://doi.Org/10.1016/J.BIOS.2008.06.005.

Wang, et al., On-Demand Droplet Release for Droplet-Based Microfluidic System f. Lab Chip 2010, 10, 559-562. https://doi.org/10.1039/b924929j.

Zhou, et al., A Microfluidic Platform for Trapping, Releasing and Super-Resolution Imaging of Single Cells. Sens. Actuators. B. Chem. 2016, 232, 680-691. https://doi.Org/10.1016/j.snb.2016.03.131.

* cited by examiner

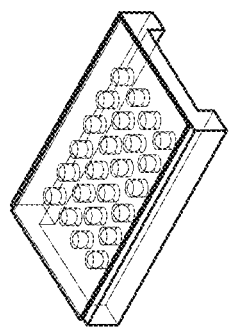
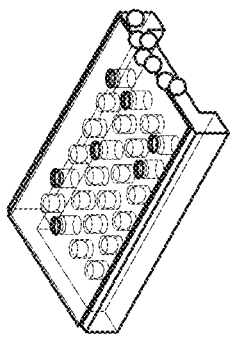
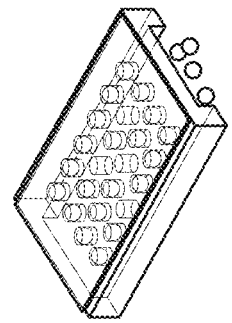
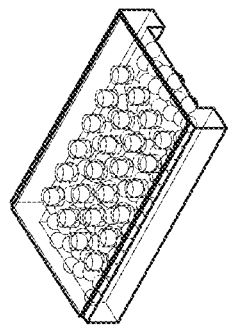
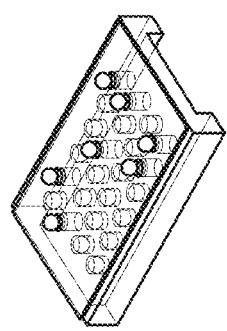
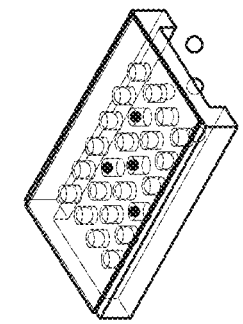
FIG. 1A
FIG. 1B
FIG. 1C
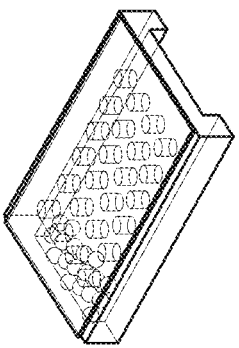
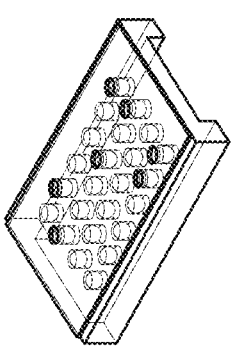
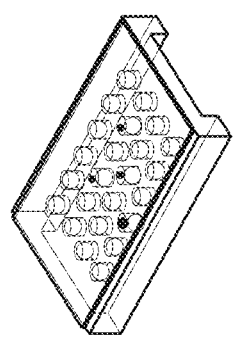
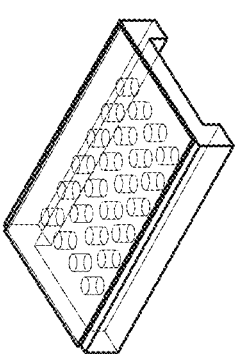
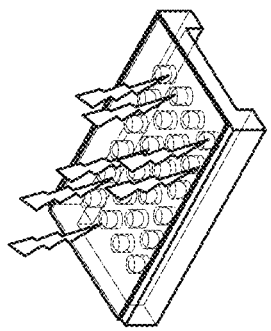
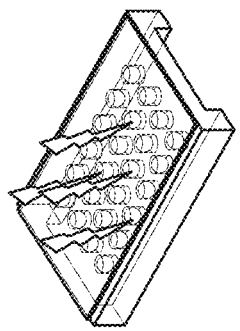

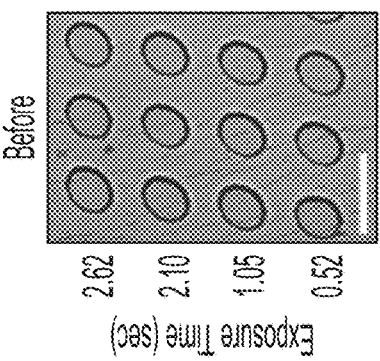
FIG. 5E
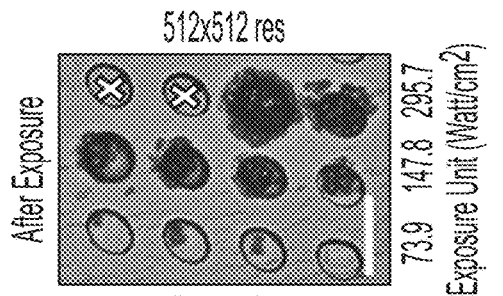
FIG. 5F
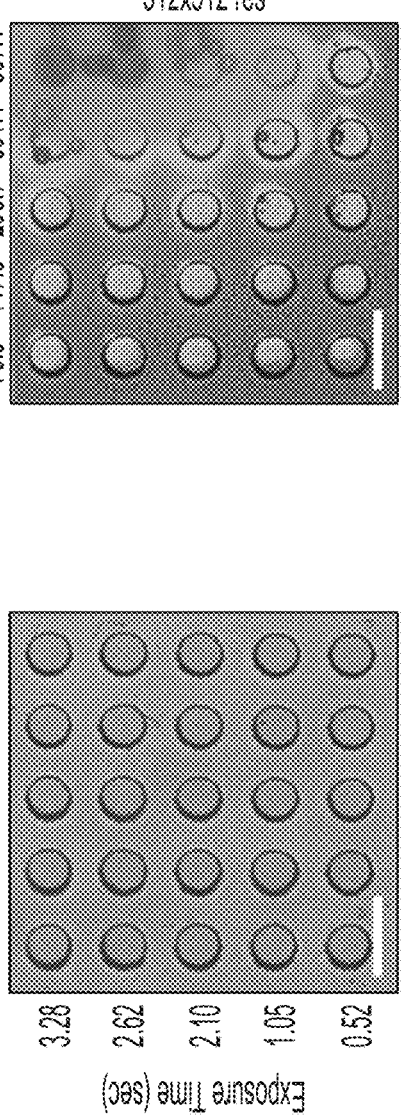
FIG. 5B
FIG. 5D
FIG. 5A
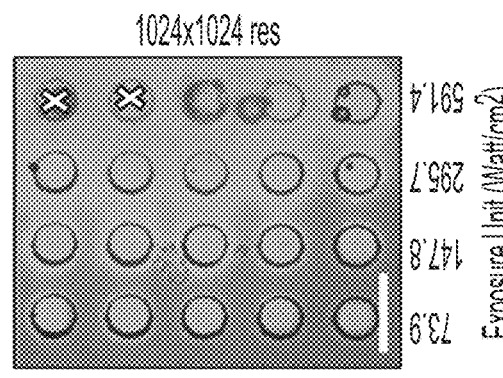
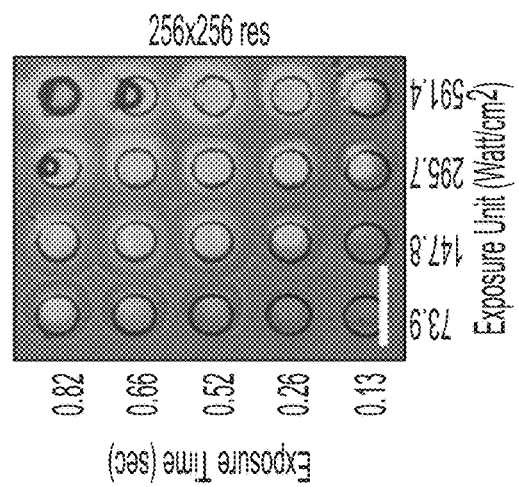
FIG. 5C

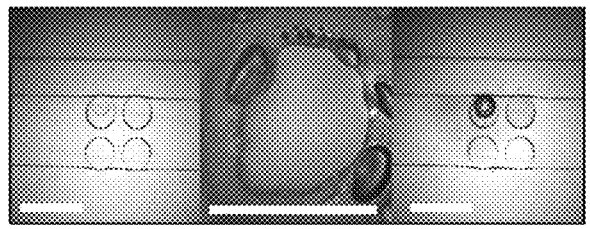
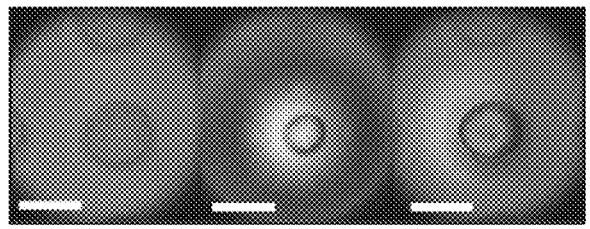
FIG. 6A　　　　　　　　　　　FIG. 6B
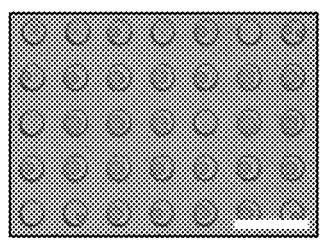
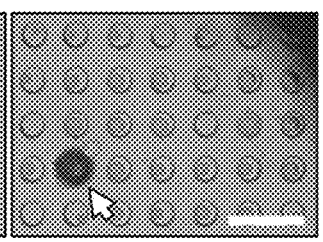
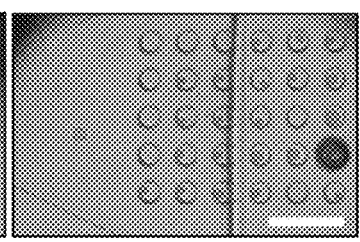
FIG. 6C-1　　　　FIG. 6C-2　　　　FIG. 6C-3
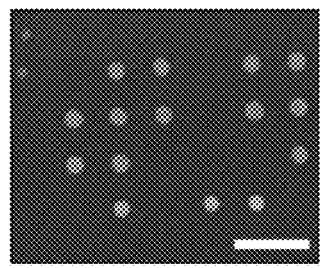
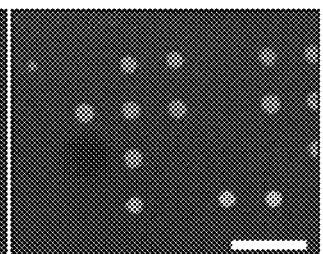
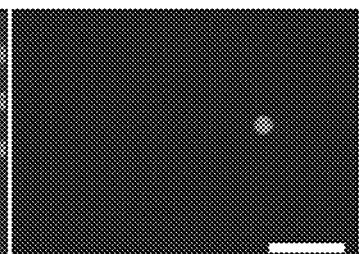
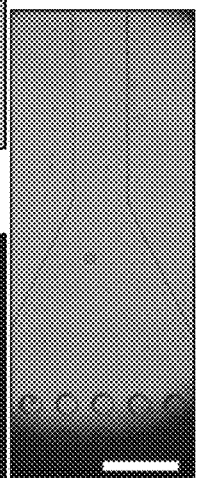
FIG. 6C-4　　　　FIG. 6C-5　　　　FIG. 6C-6　　　FIG. 6D
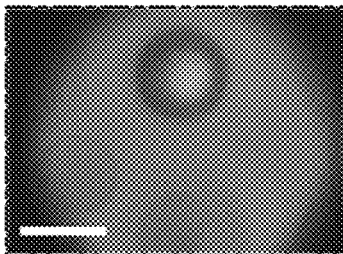
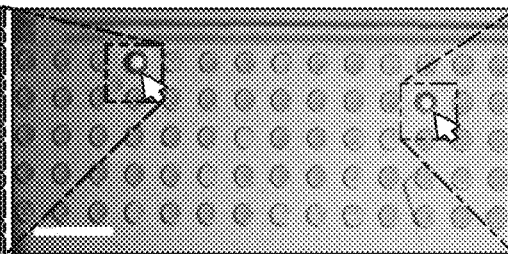
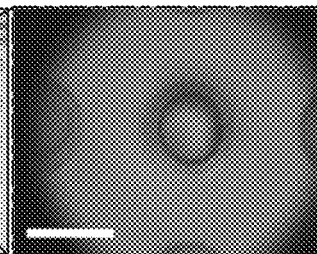
FIG. 6E-1　　　　　　FIG. 6E-2　　　　　　FIG. 6E-3

PHOTOACTIVATED SELECTIVE RELEASE (PHASR) OF DROPLETS FROM MICROWELL ARRAYS

RELATED APPLICATIONS

The present application claims priority to and the benefit of U.S. patent application No. 63/132,270, "Photoactivated Selective Release (PHASR) Of Droplets From Microwell Arrays" (filed Dec. 30, 2020), the entirety of which application is incorporated herein by reference for any and all purposes.

GOVERNMENT RIGHTS

This invention was made with government support under AI124057 and HG010023 awarded by the National Institutes of Health. The government has certain rights in the invention.

TECHNICAL FIELD

The present disclosure relates to the field of microfluidic devices.

BACKGROUND

Droplet microfluidics has enabled rapid production of highly uniform emulsion droplets with a wide range of applications. In particular, individual microfluidic droplets can be used as micro vessels, making them a versatile platform to perform rapid high throughput assays while significantly reducing the volume of reagents required.[1-4] Compared to conventional multi-well plate-based assays, the required reagent volume can be reduced, and the per-sample manipulation time can also be reduced by up to ten-fold.[1,5-7]

Several applications including single cell gene regulation, nuclear division and metabolism study require culturing of cells or monitoring dynamic events within droplets for extended periods from hours to days. Various types of static array devices have been developed for such applications which allow for real time dynamic observation of events that occur within the droplets.[8-12]

For a number of applications that involve trapping droplets in microarrays for extended periods, it is highly beneficial and desirable to recover droplets following the observation. For example, selective release of droplets that contain single cells that show a rare phenotype could enable single cell sequencing and potentially uncover the molecular basis of such a phenotype. A handful of methods have been developed for the selective recovery of droplets from microarrays. The recovery methods depend highly on the trapping methods that are used for dynamic monitoring or droplet incubation.[8,13-19] In case of the so-called pea-in-a-pod device, where droplets are guided through and physically trapped in a corrugated channel, selective recovery is not possible without using some type of barcode or labels within each droplets; such post-hoc selection from barcode is inefficient if the phenotype is rare.[25] For a micro-well array device that captures droplets by density difference, droplets can be released by simply flipping the device; however, this method is non-specific, and does not enable selective recovery.[20,21] Existing methods for selective recovery of droplets rely on mechanical actuation using pneumatic valves and/or optical tweezers, which methods require complicated control systems and also exhibit slow processing.[10,13,14,22] Mechanical actuation can trap and release droplets in both 2-dimensional and 3-dimensional arrays with considerable accuracy and precision.

However, the applicability of this approach is limited by the fact that the number of valves must at least match the number of observation chambers. This would require a rather complicated device fabrication and also require sophisticated equipment to control and deliver pressure to the necessary set of valves to enable selective release. Due to these limitations, the capacity for capture and selective release based on this approach has been limited to a few hundreds, whereas many high throughput applications including rare cell phenotyping require monitoring at least a few thousand droplets. Accordingly, there is a long-felt need in the field for improved microfluidic devices configured to manipulate droplet samples.

SUMMARY

In meeting the described needs, the present disclosure provides a microfluidic device, comprising: a well substrate having a plurality of wells defined therein, each of the wells having a first opening and a second opening; a photoresponsive layer, the photoresponsive layer being disposed so as to seal the first openings of the plurality of wells; and a trap channel, the trap channel in fluid communication with the second openings of the wells.

Also provided are systems, comprising: a microfluidic device according to the present disclosure; an illumination train, the illumination train configured to illuminate a portion of the photoresponsive layer that overlies a well, the illumination train being configured to deliver illumination so as to (a) rupture the portion of the photoresponsive layer that overlies the well, (b) effect heating proximate to or within the well sufficient to give rise to sufficient bubble formation within the well to expel contents of the well from the second opening of the well, or both (a) and (b).

Also provided are methods, the methods comprising: (a) illuminating a region of a photoresponsive layer that seals a first opening of a well defined in a substrate so as to degrade the region of photoresponsive layer and form an aperture in the photoresponsive layer through which aperture a sample located within the well exits the well; (b) illuminating a region of a photoresponsive layer proximate to a well defined in a substrate, the photoresponsive layer optionally sealing a first opening of the well, so as to effect heating proximate to or within the well sufficient to give rise to sufficient bubble formation within the well to expel contents of the well from a second opening of the well, or both (a) and (b).

Further provided are methods, comprising: interrogating one or more of a population of cells disposed in a plurality of wells, each well being sealed by a photoresponsive layer, at least some of the wells being occupied by single cells, and the interrogating being spectroscopic interrogation or visual interrogation; and for one or more cells exhibiting a selected characteristic detectable by the interrogating, illuminating the photoresponsive layer so as to (a) form an aperture in the portion of the photoresponsive layer that overlies the well and recovering the cell following the cell's exit from the aperture, (b) effect heating proximate to or within the well sufficient to give rise to bubble formation within the well that expels the cell from an opening of the well and recovering the cell.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various aspects discussed in the present document. In the drawings:

FIGS. 1A-1C provide a PHASR device overview. (FIG. 1A) Droplet static array formation by density difference. The higher density of the oil phase drives trapping of aqueous droplets in wells. (FIG. 1B) NIR-laser-based selective puncture of the photoresponsive layer and selective recovery of droplets through the top flow channel. (FIG. 1C) NIR-laser-based selective heating/bubble-generation and selective recovery of droplets through the bottom trap channel.

(FIG. 2A) Side view of the PHASR device. (FIG. 2B) Fabrication protocol for the PHASR device.

(FIG. 3A) $T_g$ PS layer, PS layer with DEGD and PS layer with DEGD and IR-780 dye measured via dynamic mechanical analysis (DMA). (FIG. 3B) Thickness of photoresponsive layer as a function of the number of flow coating as determined by profilometry.

(FIG. 4A) UV-Vis spectra of PS layer, PS layer with DEGD and PS layer with DEGD and IR-780. Suppressed transmittance region is highlighted with a red box. (FIG. 4B) FTIR spectra of PS layer, PS layer with DEGD and PS layer with DEGD and IR-780 dye. Three spectra are offset by 100% for peak visualization.

FIGS. 5A-5F provide effects of exposure time, resolution and laser intensity on the photoresponsive layer. Five exposure times in ranges 0.52 s to 3.28 s, 0.013 s to 0.82 s and 2.10 s to 13.11 s corresponds to scanning time of 2, 4, 8, 10, and 12.5 μs/Pix under specified scanning resolution. (FIGS. 5A-5D) Response of a 17 μm layer with 5% PS, 1.45% DEGD and 0.1% IR-780. (FIG. 5A) 5×5 microwell array with the 17 μm photoresponsive layer. (FIGS. 5B, 5C, 5D) Effect of light exposure intensity and time on photoresponsive layer using 512×512 scanning resolution, 256×256 scanning resolution, 1024×1024 scanning resolution, respectively. Wells with red X marks in (FIG. 5D) were not exposed. (FIGS. 5E-5F) 17 μm photoresponsive layer with 5% PS, 0.45% DEGD, 0.025% IR-780. (FIG. 5E) High $T_g$ photoresponsive layer with 3×4 microwell array. (FIG. 5F) Effect of light exposure intensity and time on photoresponsive layer with high $T_g$ using 512×512 scanning resolution. Wells with red X marks in (FIG. 5F) were not exposed. Scale bars are 120 μm.

FIGS. 6A, 6B, 6C-1, 6C-2, 6C-3, 6C-4, 6C-5, 6C-6, 6D, 6E-1, 6E-2, and 6E-3 provide a demonstration of PHASR from microwell arrays. (FIG. 6A) SiNc-based PHASR via formation of a hole from a 2×2 microwell array with total exposure energy of 727.34 J/cm². (FIG. 6B) IR-780-based PHASR via formation of hole with total exposure energy of 5,425.96 J/cm². (FIG. 6C) (FIG. 6C-1) Device with trapped droplets under brightfield microscopy, (FIG. 6C-2) Device under brightfield after total exposure energy of 620.11 J/cm². The bubble occupies the well as it pushes out the droplet which was originally trapped in the well. Bubble is marked with red arrow and droplet pushed out is at right top of the well. (FIG. 6C-3) Bubble-induced droplet release under brightfield after release. (FIG. 6C-4) Fluorescence image of FIG. 6C-1; the device is filled with a mixture of fluorescent and non-fluorescent droplets, (FIG. 6C-5) Florescence image of FIG. 6C-2; the focal plane is set to show the droplets in the microwells, (FIG. 6C-6) Droplet flowing out of the device. (FIG. 6D) Droplet entering exit channel under brightfield microscopy. (FIG. 6E-1) First droplet pushed out of well by bubble formation from blue dotted box of FIG. 6E-2, (FIG. 6E-2) Wide field view of two droplets released by bubble formation. Bubble are indicated with red arrows. (FIG. 6E-3) Second droplet pushed out of well by bubble formation from orange box of FIG. 6E-2. White scale bars represent 200 μm and yellow scale bars represent 60 μm.

(FIG. 8B) NIR laser irradiation on the top of the photoresponsive layer heats and punctures the layer, allowing droplet to float through the opening and into the top flow channel for release-up recovery. (FIG. 8C) NIR laser exposure on the bottom of the photoresponsive layer creates a bubble which pushes out the droplet toward the bottom trap channel for push-down recovery.

DETAILED DESCRIPTION OF ILLUSTRATIVE EMBODIMENTS

Figure 2A:
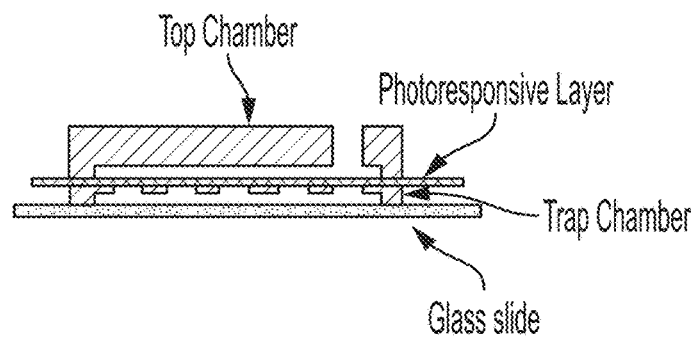
FIGS. 2A-2B provide an overview of the PHASR device and fabrication protocol.

The present disclosure may be understood more readily by reference to the following detailed description of desired embodiments and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently of the endpoints, 2 grams and 10 grams, and all the intermediate values). The endpoints of the ranges and any values disclosed herein are not limited to the precise range or value; they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. In at least some instances, the approximating language may correspond to the precision of an instrument for measuring the value. The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4. Further, the term "comprising" should be understood as having its open-ended meaning of "including," but the term also includes the closed meaning of the term "consisting." For example, a composition that comprises components A and B may be a composition that includes A, B, and other components, but may also be a composition made of A and B only. Any documents cited herein are incorporated by reference in their entireties for any and all purposes.

Figure 8A:
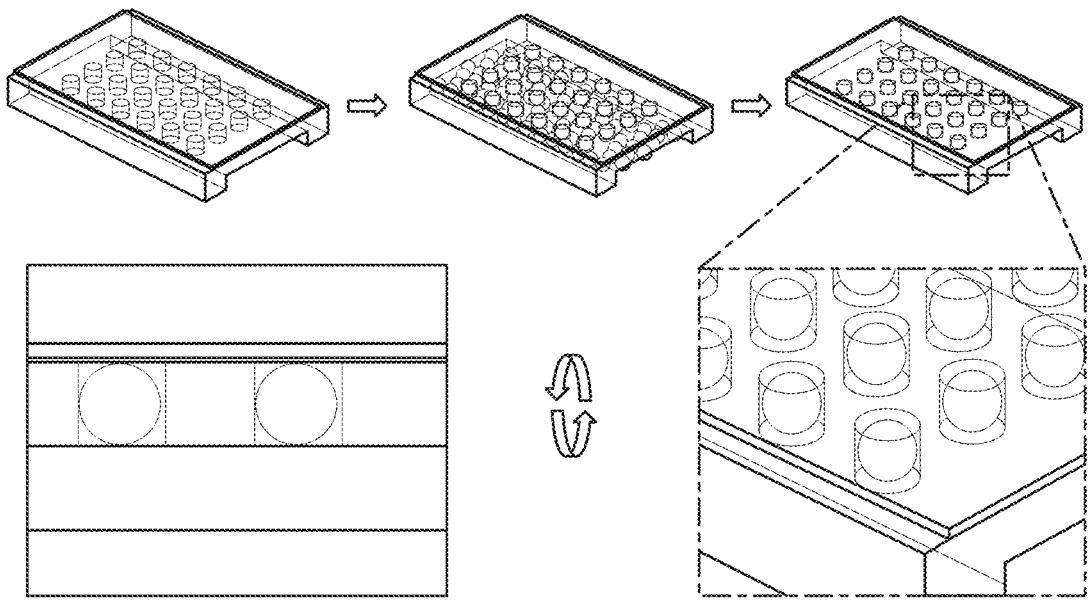
FIGS. 8A-8C provide (FIG. 8A) Droplet static array formation by density difference. The higher density of the oil phase drives trapping of aqueous droplets in wells.
Figure 8B:
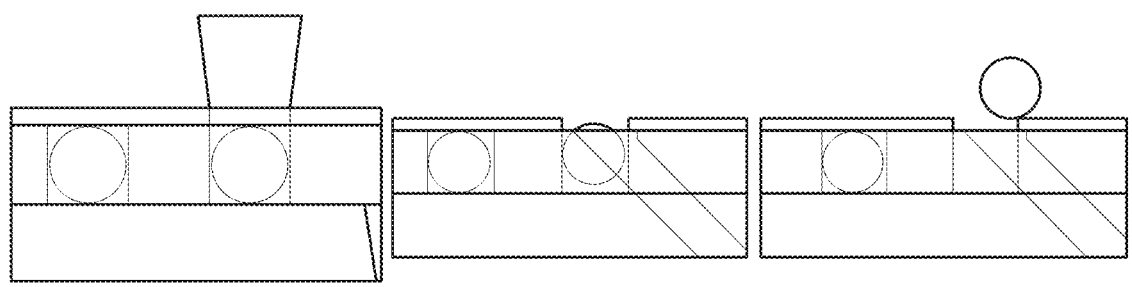
Figure 8C:
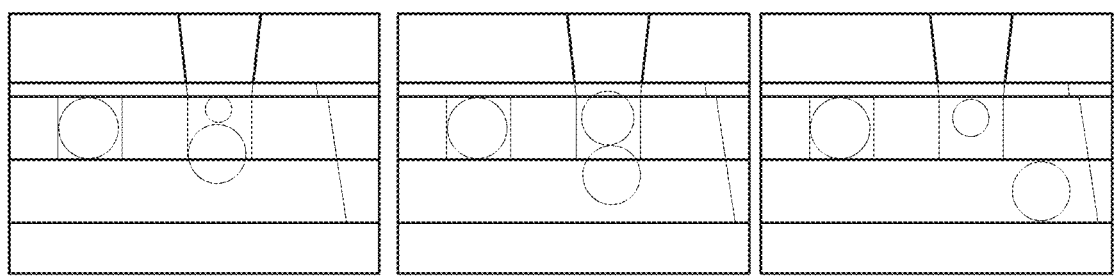

In this disclosure, we provide, inter alia, a method to capture and selectively release droplets from a microwell array by combining a photoresponsive layer with the conventional microfluidic device fabrication technique. The photoresponsive layer, made of a glassy polymer, polystyrene, a photoresponsive dye and a plasticizer, is sandwiched in between the microwell array and a monolithic channel that is used to apply positive and negative pressure. It should be understood, however, that the presence of a monolithic channel is optional and is not required in all embodiments. For example, a device can comprise a well formed in a substrate, with the well having one opening sealed by a photoresponsive layer, without a further slab or channel on the other side of the photoresponsive layer. Illumination of the photoresponsive layer can (as described elsewhere herein) give rise to local heating and bubble formation within the well, which bubble formation can act to expel a droplet from the well back into the channel that initially delivered the droplet to the well (e.g., as shown in FIG. 8C), rather than into a different channel (e.g., a monolithic channel) that is disposed on the other side of the photoresponsive layer from the well and that becomes accessible to the droplet in the well when the photoresponsive layer ruptures.

The glass transition temperature and absorption spectra of the photoresponsive layer can be engineered to address a variety of experimental needs. Furthermore, the incorporation of the photoresponsive layer minimally alters the chip fabrication process and the selective recovery of the samples can be performed without relying on a large number of supporting instruments. Previous studies have incorporated aluminum patterns that serve as heating blocks into a device or used focused UV laser to heat the oil interface adjacent to the droplet to release droplets.[14,23] As described herein, one can use as illumination a NIR laser which is far less harmful to biological molecules and cells than UV laser. An illustrative experiment demonstrated photoactivated selective release (PHASR) of droplets from a photoresponsive layer-embedded micro-arrays consisting of 4,400 wells which, to the inventors' knowledge, is the largest capacity reported for dynamic observation with selective recovery to date. Arrays with even larger number of wells can be used, e.g., about 4,000; about 5,000; about 10,000; about 15,000; about 20,000; about 25,000; about 30,000; about 35,000; about 40,000; about 45,000, and more; arrays of 42,000 wells have been constructed. Moreover, this method does not require any extra instruments that scale with the number of chambers. Thus, we anticipate that the PHASR method enabled in this high-throughput system will benefit many research fields utilizing phenotyping in combination with genotyping such as molecular biology and immunology.

Experimental Methods

Device Fabrication

The device masks are designed using AutoCAD 2018 and printed by CAD/Art Service, Inc. (CA, USA). A master mold is fabricated on a 3" silicon wafer (University Wafer Inc, MA, USA) using the conventional soft lithography technique. The master molds are all fabricated inside a cleanroom in the Quattrone Nanofabrication Center of the Singh Center of Nanotechnology at the University of Pennsylvania. A positive photoresist KMPR-1050 (MicroChem, MA, USA) is used and the thickness of the molds is controlled by adjusting the rotation speed of spin coating in conjunction with the UV exposure time under a mask aligner (SUSS Microtec, Garching, Germany). To produce the master for the bottom trap channel, a multi-layer mold fabrication method is employed. Multi-layer mold fabrication skips mold development after initial post-bake and proceeds with spin-coating of the second photoresist layer. Top flow channel and droplet generator molds are fabricated via the single layer soft lithography technique. Fabricated master molds are subsequently silanized with trichloro(1H,1H,2H,2H-perfluorooctyl)silane (PFOTS) to facilitate the detachment of cured polydimethylsiloxane (PDMS). Polydimethylsiloxane (PDMS) precursor is prepared by mixing the base and curing agents of Sylgard 184 (Dow Corn0069ng Corp, MI, USA) in a 10:1 ratio and is degassed in a vacuum chamber for 30 minutes.

The degassed PDMS mixture is poured onto the master molds. The thicknesses of the droplet generator and top flow channel are ~3 mm~1 mm, respectively. The thickness of the bottom trap channel is made to completely cover the channel structures. All molds are placed in an aluminum foil pan and degassed for another 30 minutes. After degassing, the top flow channel mold and the droplet generator mold are kept in an oven for 4 hours at 65° C. The droplet generator PDMS is bonded to a plain glass slide using a conventional oxygen plasma treatment. A thin clear polyester film is slowly placed on top of the uncured PDMS on the bottom trap channel while minimizing bubble formation. A 2×3" glass slide is placed on top of the film and then binder clips and a 3-prong clamp are used to apply compressive pressure onto the sandwiched layers of glass slide, polyester film, PDMS solution and the wafer. The clamped device is left at room temperature for 1 hour to allow uncured PDMS to completely squeeze out and then placed in an 80° C. oven for 2 hours. Fully cured bottom trap channel is peeled off from the master mold under ethanol. The polyester film is left on the bottom trap channel. Other PDMS layers are peeled and prepared regularly. The base of bottom trap channel is taped with scotch tape to keep the surface clean.

The photoresponsive layer is fabricated using polystyrene (PS) of MW 192,000 and di(ethylene glycol) Dibenzoate (DEGD) with IR-780 iodide (Sigma-Aldrich, MO, USA). Two dyes are tested in the study with target actuation spectra in near infrared region: IR-780 and silicon 2,3-naphthalocyanine bis(trihexylsilyloxide) (SiNc). In 10 ml of chloroform, 5 wt. % PS, 1.45 wt. % DEGD and 0.1 wt. % IR-780 are added. The solution is left in a mixer and sonicating bath for 1 hour each. Subsequently, the solution is filtered through a 5 μm PTFE syringe filter. The solution is stored in a tightly sealed vial with aluminum foil covering to prevent photobleaching of the photoacoustic dye. A thin photoresponsive layer is prepared using a flow coater. A clean glass slide is placed on a doctor blade coater (NRT100, ThorLab, NJ, USA). Approximately 2 ml of the photoacoustic solution is evenly casted on 2"×3" glass slides using coating speed of 20 mm/sec and acceleration of 1 mm/sec$^2$. Casted layers are dried under vacuum for 24 hours in dark prior to use. The inlets and outlets for the bottom trap and top layers are punched using a 1.0 mm disposable biopsy punch (Integra Miltex, NJ, USA). Punched layers are washed with isopropanol, dried using pressurized nitrogen and baked in an oven for another 10 minutes.

Figure 2B:
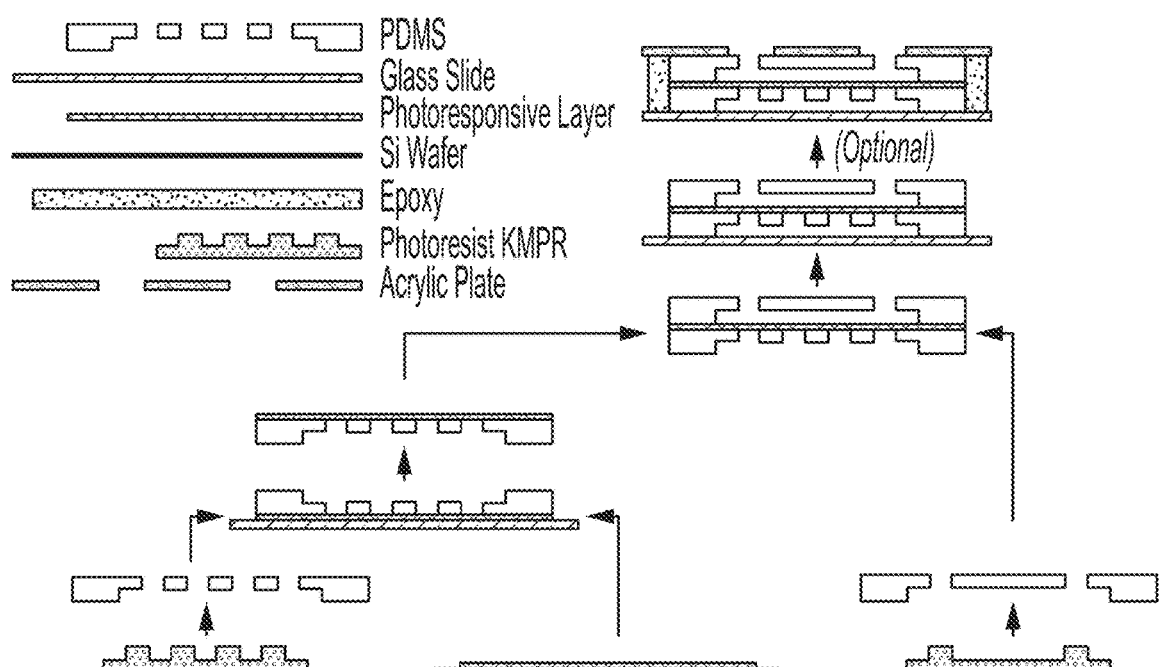

The chip assembly process starts with bonding of the bottom trap channel PDMS with the photoresponsive layers. The overview of the fabricated device and fabrication step protocol is schematically shown in FIG. 1 and FIG. 2 respectively. The vacuum dried photoacoustic layer on a glass slide and the top of bottom trap channel are oxygen plasma treated at 50 Watts for 45 seconds (SCE 110, Anatech Ltd, MI, USA) and bonded together. The bonded devices are left undisturbed for 2 hours to ensure bonding, then the device is carefully peeled off from the glass slide. The inlet and outlet holes are punctured on the top flow channel PDMS using a 1-mm biopsy punch. The base side of the top flow channel is bonded onto the top surface of the photoresponsive layer using the same oxygen plasma treatment and stored for additional 2 hours; this bonding requires alignment of the bottom trap channel structure to the top flow channel structure and can be performed with high fidelity under a mask aligner or stereoscope. After punching inlet and outlets in the bottom trap channel, the base of the bottom trap channel is bonded to a glass slide. To enable use under a high-pressure flow system, 1/16" clear acrylic plate is custom-tailored (PLS 4.75, Universal Laser Systems, AZ, USA) and bonded with the base glass slide using 5-min epoxy.

Droplet Generation and Trapping

A droplet generator made with PDMS is silanized with 2% PFOTS solution in FC-40 oil for 5 minutes following plasma treatment. The device is flushed with neat FC-40 oil then connected with two PTFE tubings, each connected to a syringe, one filled with FC-40 containing 2 wt % EA-surfactant and the other filled with aqueous solution with or without dye. An aqueous dye such as dimethyl blue can be added to facilitate the visualization of the droplets. Flow rates of 250 μL/hr and 200 μL/hr are used for oil and aqueous phase, respectively. Prior to the droplet introduction, the PHASR device is flushed with neat FC-40 for 2 minutes to remove air bubbles within the device. In addition, the FC-40 oil phase with 2% PFOTS is flown into the PHASR device to make the channel hydrophobic and prevent droplet adhesion to the channel wall. Droplets generated from the droplet generator travel through a PTFE tubing and enter the bottom trap channel of the PHASR device. With >60% of the wells filled with droplets, the droplet injection tubing is disconnected, and neat FC-40 oil is injected slowly to fill remaining wells with the droplets. Flow rate of the oil phase is increased to 500 μL/hr to remove un-trapped droplets from the channel.

Selective Release of Droplets

All selective release and recovery experiments are conducted at the Vision Research Center of the University of Pennsylvania. To selectively release droplets, we use a home-built two-photon microscope, since the two-photon microscope ensures precise targeting of a specific location within the PHASR device with minimal off-target effects. The mode-locked titanium:sapphire (Ti:Al$_2$O$_3$) laser (Chameleon, Coherent, Santa Clara, CA) is used as an excitation source with the wavelength of 780 nm for IR-780-based photoresponsive layers. The laser has output power of 3.37 Joule/s at 780 nm wavelength, and the pass-through percent of the power is calculated to be roughly 20% of the output. Under 60× water-immersion objective, 5% intensity corresponds to 73.9 J/s·cm$^2$ exposure intensity. In case of a SiNc-based photoresponsive layer, the wavelength is tuned to 775 nm. The exposure energy of 155.03 J/cm$^2$ is sufficient to release droplets using an IR-780-based photoresponsive layer. We calculate the exposure energy in units of J/cm$^2$ by multiplying the exposure intensity in Joule/s·cm$^2$ by the total exposure time; exposure time results from scanning resolution and the scanning rate. The target is identified within the field of view using a low magnification objective, and then the objective is replaced with a 60× water-immersion objective to zoom-in on the target. The schematics of droplet trapping and release via the two mechanisms are shown in FIG. 2. Depending on the method of recovery, the focal plane is set either at the top of the photoresponsive layer to induce hole formation or at the base for bubble formation. Droplets released from the microwell array are recovered by flowing oil through the channel.

Results and Discussion

Droplet microfluidics can readily isolate cells, particles and even single molecules into individual droplets which can subsequently be arranged into an array that enables monitoring of dynamic events such as cell response to external stimuli or (bio)chemical reactions. Photoresponsive-layer enabled photoactivated selective release (PHASR) of droplets from a microwell array, we explore in this study, is schematically illustrated in FIG. 1. One can use density difference between continuous and dispersed phases to trap droplets into microwell arrays as shown in FIG. 1A. This method is advantageous over other methods of droplet trapping because of the ease of device fabrication. The target droplets for further investigation can be identified through optical measurements of individual cells in the microarray. These measurements can be taken over time, for example, using physiological reporter probes. The microarrays are fully compatible with an environmental chamber capable of full gas and humidity control. Once the targets are identified, they can be released from the static array using two different methods as illustrated in FIGS. 1B and 1C. High intensity short burst light can be focused onto the photoresponsive layer to induce rupture of the membrane over specific microwells that contain the target droplets (FIG. 1B); droplets can float through the pore and escape the microwell or they can be pushed downward and released by applying positive pressure to the top monolithic channel. If moderate intensity light is focused onto the photoresponsive layer above a selected well, this will lead to bubble formation which in turn pushes out the droplet from the array as illustrated in FIG. 1C. In case of the membrane-rupture induced release, the order of droplet release can be random as there is little concern for recapturing of droplets, although the order of droplet release can also be non-random, e.g., according to a schedule or order set by a user. In the case of bubble-mediated release, droplets can be released sequentially in the direction of the flow to prevent droplets from being recaptured by empty microwells. It should be understood, however, that the disclosed technology also allows for capturing cells with identified wells-of-origin. For example, each released cell can be captured in the order of release.

The device fabrication involves fabrications of three individual layers—the bottom microwell capture layer made of polydimethylsiloxane (PDMS), the middle photoresponsive layer made of polystyrene (PS) and the top PDMS monolithic channel layer—followed by their sequential bonding as shown in FIG. 2. To enable release of droplets through a punctured membrane, the bottom trap PDMS channel must have an open top structure. Even a thin layer of PDMS on the top of each microwell will not allow release of droplets through the punctured membrane. To ensure complete open-top structure in the PDMS channel, uncured PDMS, poured on the master, is compressed between a polyester plate and the hard master using a 3-prong laboratory clamp, applying pressure of approximately 7 kPa. Given sufficient time, uncured PDMS squeezes out of the space between the polyester film and the patterned photoresist completely. A minimum of 1 hour is used to ensure that the microwell array layer has an open top structure. Although our demonstration of selective release will be performed with a PHASR device with 4,400 wells, we can readily fabricate a PDMS microwell array with up to 40,000 open-top wells. Solvent-casted photoresponsive layer serves as the top surface (i.e., ceiling) of the bottom trap PDMS layer with open-top microwells. To enable membrane-rupture induced release, we add a monolithic open channel atop the photoresponsive layer. The push-down release device does not require such a top channel. Layers are bonded via oxygen plasma treatment, and optional epoxy-based sealing can be added for systems that deal with high pressure flows.

The most essential component of this PHASR device is the photoresponsive layer. We chose to use a glassy thermoplastic polymer, polystyrene (PS) as the base material for this purpose. PS is chosen because free standing films of PS can be readily prepared by using highly entangled PS.[24] Moreover, its thermomechanical properties can be engineered by incorporating a plasticizer. To render PS responsive to near-infrared (NIR) light, we use a photoacoustic dye such as IR-780 iodide (MW~667 g/mol) or silicon 2,3-naphthalocyanine bis(trihexylsilyloxide) (SiNc) (MW~1,340 g/mol). Both are well known photoacoustic dyes in the range of NIR with extinction coefficients greater than 250,000 $M^{-1}$ $cm^{-1}$. These dyes also have high solubility in good solvents for PS such as chloroform and tetrahydrofuran. Although the quantum yields for these two dyes have not been reported, dyes with similar structures such as IR-800 have quantum yields of 0.034[33,34], indicating that much of the absorbed energy is dissipated via thermal mechanisms, leading to heat generation.

Figure 3B:
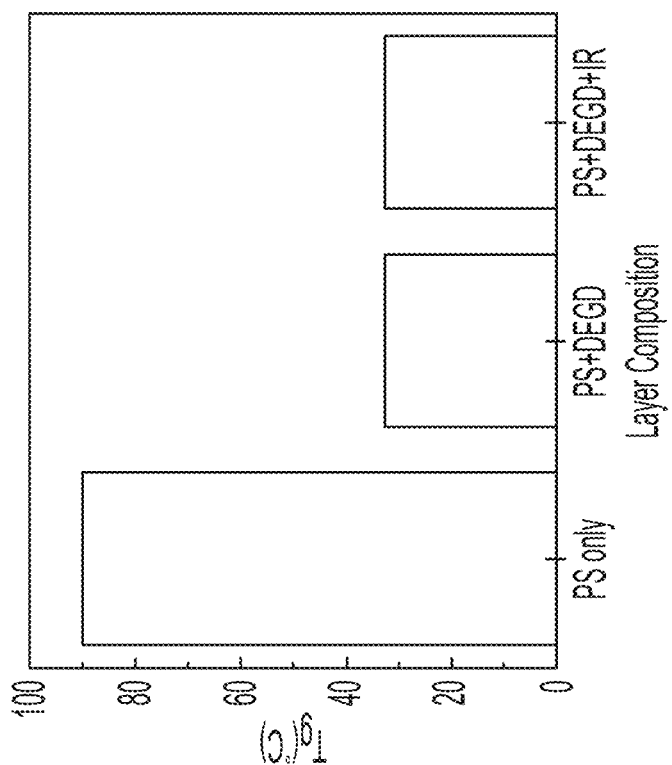
FIGS. 3A-3B provide characteristics of photoresponsive layer with IR-780 dye.
Figure 3A:
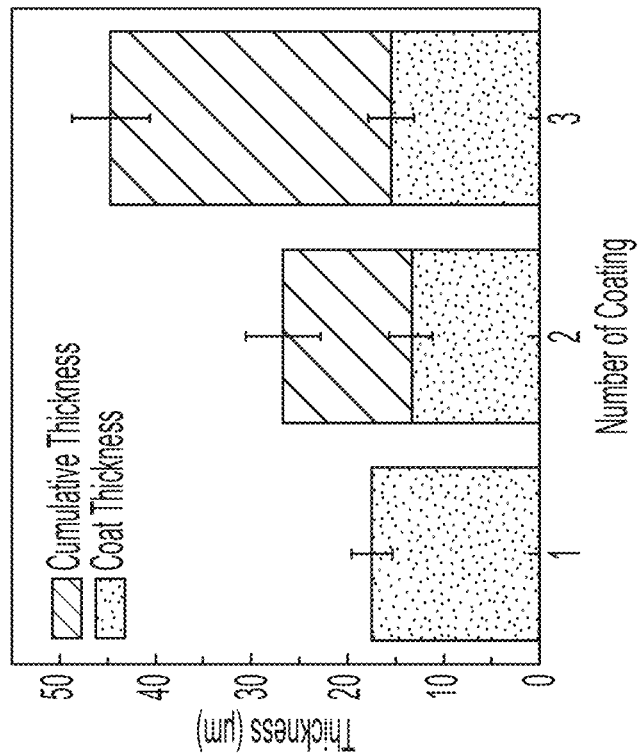

The glass transition temperature of PS is 90-100° C., which likely is too high for use in the proposed scheme. To ensure that PS responds to light at a more reasonable temperature such that the generated heat would not damage the encapsulated molecules and cells, we add a plasticizer, di(ethylene glycol) dibenzoate (DEGD) (MW~314 g/mol). DEGD is added to the PS solution at 1.45 wt % which is equivalent to 29 wt % of the mass of PS. The polymer solution along with the plasticizer and one of the two photoacoustic dyes remains clear and optically transparent during preparation, indicating high solubility of the three components in chloroform. The doctor-blade method is used to coat the solution onto a clean glass slide. The film is dried under vacuum to completely remove the solvent, leading to the formation of an optically transparent and slightly green solid film. The addition of DEGD reduces the glass transition temperature ($T_g$) of PS significantly to 33° C., and the addition of the photosensitive dye does not significantly change the $T_g$ as seen in FIG. 3.[35] The suppression of 60° C. in $T_g$ agrees well with previously reported results.[25] This study mainly uses a photoresponsive layer with $T_g$ of 33° C. to minimize the potential heat damage on living cells in droplets. If the device requires incubation or imaging at 37° C., the composition of photoresponsive layer can be easily adjusted to achieve $T_g$ of ~40° C.

Although thin photoresponsive layers would be advantageous in the rupture-induced release method, layers thinner than 15 μm can be damaged during device fabrication. The minimum thickness that provided reasonable mechanical integrity for device fabrication was approximately 17 μm. The solution concentration of PS and the blade coating condition (gap height=200 μm, speed of blade translation=20 mm/sec, polymer concentration=5 wt %) are thus adjusted to give a 17 μm PS film. The thickness of the PS layer can be increased in ~14 μm increments with additional coatings as shown in FIG. 3.

Figures 4A, 4B:
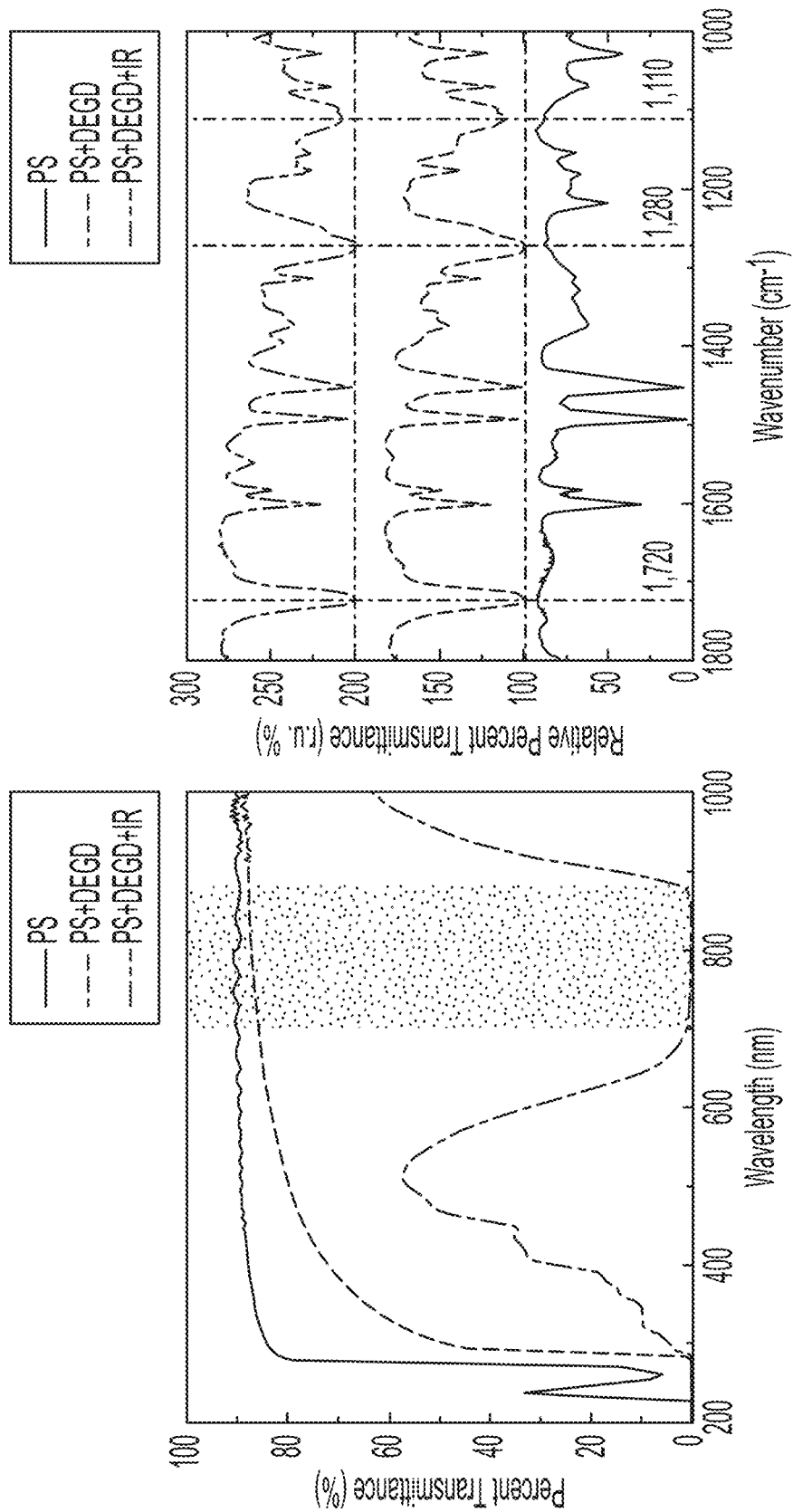
FIGS. 4A-4B provide optical characterization of photoacoustic dye-incorporating PS layer.
Figure 7:
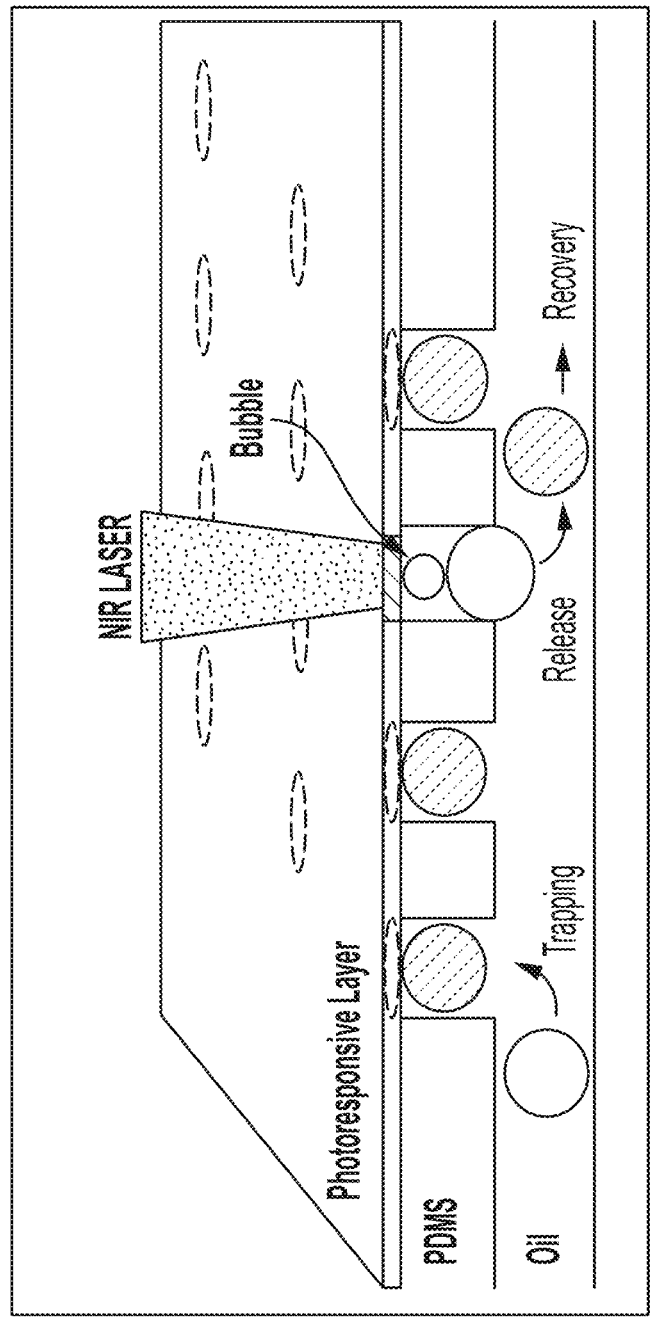
FIG. 7 provides a depiction of the disclosed technology, showing how local heating effected by a near-IR (NIR) laser can give rise to bubble formation in a well, which bubble formation acts to release a sample from the well, which sample can then be recovered.

We also assessed the optical properties of the layer as shown in FIG. 4. The FTIR spectra of the layers confirm the incorporation of DEGD as can be seen by the peaks at 1,110 $cm^{-1}$, 1,280 $cm^{-1}$ and 1,720 $cm^{-1}$ which correspond to the secondary alcohol C—O, aromatic ester C—O and carboxylic acid C=O, respectively, of DEGD. More importantly, the UV-visible (UV-Vis) spectra show that the addition of the photoacoustic dye IR-780 significantly increases the light absorption in the range of 700-900 nm wavelength while maintaining a large window of transparency in the visible range, which is important to ensure direct monitoring of droplets using optical and/or fluorescence microscopy. If maximum fluorescence signal is necessary, an inverted microscope can be used to minimize the light-path absorption from the top layer.

The key feature of the PHASR device is the capability to specifically and locally heat the photoresponsive layer to puncture the membrane or push out the targets from the selected microwells. With two different photoacoustic dyes, we test the ranges of parameters that enable selective release. IR-780 dye is used primarily in this study because of its low cost and commercial availability. A home-built two photon confocal microscope is used in the study which can deliver highly focused light to a well-defined region. We set the exposure wavelengths at 775 nm and 780 nm for SiNc- and IR-780-incorporated layers, respectively.

The effects of laser intensity and scanning parameters on the integrity of the photoresponsive layers are shown in FIG. 5. The exposure area with 60× water-immersion objective and 5× optical zoom is 50 µm by 50 µm, which is close to the size of each well (60 µm in diameter). Depending on the exposure condition and the focal plane, either punctured layer or bubble generation is seen. Energy exposure of 1,240.22 J/cm$^2$ is necessary to create holes in the IR-780-incorporated photoresponsive layer with $T_g$ of 33° C. The dye in the photoresponsive layer undergoes photobleaching upon illumination as seen by the color change around the irradiated region. The extent of photobleaching, which can be assessed by the area of photobleached region that extends beyond the irradiated area, increases as the intensity and irradiation time are increased. Among the two factors, the exposure time seems to have a bigger influence on the extent of photobleaching than the light intensity.

We also test the effect of the $T_g$ of the photoresponsive layer on hole formation under NIR irradiation. By reducing the concentration of DEDG to 9 wt % of PS, the $T_g$ can be increased to 68° C. Interestingly, holes can be formed in this photoresponsive layer with a relatively low exposure energy of 77.51 J/cm$^2$ as seen in FIG. 5. This result indicates that a lower $T_g$ does not necessarily mean that a lower intensity laser and/or a shorter irradiation time is needed to puncture the membrane and that the brittleness of the photoresponsive film may play a crucial role in determining the irradiation parameters that induce pore formation.

The focal plane of focused laser with respect to the plane of the photoresponsive layer also plays an important role in determining the mode of droplet release from microwells. When the focal plane is set to the top or middle of the photoresponsive layer with exposure energy of 242.23 J/cm$^2$ under the scanning resolution of 256×256 or 310.06 J/cm$^2$ under the scanning resolution of 512×512, the photoacoustic dye induces local heating within the film, leading to the formation of hole(s) in the photoresponsive layer as seen in FIGS. 6A and 6B. Minimum of 242.23 J/cm$^2$ is required to create a hole in both SiNc and IR-780 based layers with a $T_g$ of 33° C. In contrast, when the focal plane is set to the base of the photoresponsive layer, 77.51 J/cm$^2$ exposure energy is required to create bubble formation that can be used to push out the droplets. This bubble pushes the droplet out of the well to the bottom trap channel as shown in FIG. 6C. This result indicates that when a low intensity light is focused on the base side of the photoresponsive layer, heat is dissipated into the oil and induces bubble formation. The bubble eventually disappears upon cooling, and its dissolution can be expedited by continuously flowing the oil phase. Although push-down release introduces a possibility of re-capture, continuous flow in the bottom trap channel can minimize such an occurrence. For membrane-rupture induced release, laser intensity should be kept high and laser should be precisely positioned to the target microwell arrays to prevent bubble formation which could induce push-down release of droplets due to local heating.

Upon PHASR, the continuous flow of the oil phase guides the released droplets to the outlet of the PHASR device for their recovery. Using the proposed method, we are able to release approximately one droplet per second. By automating the stage translation and light irradiation, one can accelerate the recovery of identified targets from microwells.

Conclusions

In summary, we demonstrate that droplets can be captured and selectively released with high speed and precision by incorporating a photoresponsive layer into a microwell device. The properties of the photoresponsive layer can be tailored by changing the plasticizer concentration, photoacoustic dye and thickness to meet the specific requirements for the samples encapsulated in the droplets. We also show that droplets can be released by inducing rupture of the photoresponsive layer or by inducing bubble formation in the microwells. Our results demonstrate that the PHASR device is a powerful platform that enables high throughput assays that require extended incubation of droplets and recovery of analytes from a subset of captured droplets. Although certain illustrative experiments focus on using the photoresponsive layer for PHASR of droplets from microwell arrays, the disclosed technology can also be used in other applications that require site-specific heating, e.g., in various micro total analysis systems.

ASPECTS

The following Aspects are illustrative only and do not limit the scope of the present disclosure or the appended claims.

Aspect 1. A microfluidic device, comprising:
a well substrate having a plurality of wells defined therein, each of the wells having a first opening and a second opening;
a photoresponsive layer,
the photoresponsive layer being disposed so as to seal the first openings of the plurality of wells; and
a trap channel, the trap channel in fluid communication with the second openings of the wells.

It should be understood that a device can be arranged such that the photoresponsive layer is arranged atop a well, i.e., so as to cover the upper or top opening of a well, as shown in, e.g., FIG. 2. In such an arrangement, a droplet (with the droplet being less dense than a continuous phase in which the droplet is disposed) can be communicated through a channel beneath the well such that the relatively less dense droplet rises into the well. Upon rupture of the photoresponsive layer, the droplet can rise upwards out of the well, through the rupture formed in the photoresponsive layer.

It should also be understood that the trap channel can be used to deliver droplets to one or more wells and then also be used to collect one or more droplets that are expelled or otherwise exit the one or more wells. In such an embodiment, it is not necessary to have a channel on the other side of the photoresponsive layer from the well.

Without being bound to any particular theory or embodiment, the disclosed technology can include an automated collection device that guides released droplets into indexed collection vesicles or vessels. In this way, one can efficiently collect and categorize droplets, e.g., by content, by treatment, and the like. Such collection can be automated, e.g., via moveable conduits, automated valving, automated pumps, and the like. In this way, a device can be operable so as to direct released droplets to collection locations (vessels, vesicles, wells, and the like). The guidance of a given droplet can be varied depending on conditions. For example, the location to which a droplet (that exits a well) is guided can be dependent on some characteristic of that droplet (e.g., a visual characteristic) such that not all droplets are necessarily guided to the same location. Instead, released droplets can be guided to destination locations in an automated, variable way that depends on the droplets' own characteristics.

As but one example, if a droplet is determined to possess a certain characteristic (e.g., a certain level of fluorescence), that droplet can be guided to a first receiving vesicle by an automated collection system that is configured to guide droplets having that certain characteristic to that first receiving vesicle; the automated collection system can be configured to guide droplets that do not possess that certain characteristic to a different receiving location. In this way, the disclosed systems enable high-efficiency analysis, as they can operate to guide different populations of droplets to different locations (e.g., on the basis of the droplets' characteristics) for further analysis and review.

In another embodiment, a device can be arranged such that the photoresponsive layer is arranged below a well, i.e., so as to cover the lower opening of a well. In such an arrangement, a droplet (with the droplet being denser than a continuous phase in which the droplet is disposed) can be communicated through a channel above the well such that the relatively dense droplet falls into the well. Upon rupture of the photoresponsive layer, the droplet can exit the well downwards, through the rupture formed in the photoresponsive layer.

Aspect 2. The microfluidic device of claim 1, further comprising a collection device, the collection device configured to guide a droplet released from a well. The collection device can include a vessel (e.g., vesicle) to which droplets are guided.

Aspect 3. The microfluidic device of Aspect 2, wherein the collection device is operable in an automated manner. The collection device can be programmable, e.g., to guide droplets based on sensed criteria, which criteria can be updated and/or changed.

Aspect 4. The microfluidic device of Aspect 2, wherein the collection device comprises a pump, a valve, a conduit, or any combination thereof. As but one example, a collection device can include one or more moveable conduits, which moveable conduits can be moved so as to define a flow path that guides one or more droplets. The flow path can be variable, e.g., can be changed in an automated (or manual) manner depending on the desired destination of collected sample that is guided by the collection device. A collection device can include, e.g., a plurality of conduits and one or more valves, which valves are operable to define different flow paths within the plurality of conduits. One or more pumps can be used to motivate droplets along a flow path.

Aspect 5. The microfluidic device of Aspect 2, further comprising a collection vessel capable of fluid communication with the collection device.

Aspect 6. The microfluidic device of Aspect 2, wherein the collection device is configurable between at least a first state and a second state, wherein the first state and the second state each define a different flow path for the droplet.

Aspect 7. The microfluidic device of any one of Aspects 1-6, further comprising a first channel disposed such that the photoresponsive layer interrupts fluid communication between the first channel and the first openings of one or more of the wells. The first channel can be, e.g., configured to collect droplets that exit the first channel, such as droplets that exit in a direction away from the trap channel. The first channel can be, as described herein, located above an upper opening of a well or below a lower opening of a well.

In one non-limiting embodiment (shown in FIG. 2), the photoresponsive layer can be placed over the top openings of a well or wells. Low-density droplets can be flowed beneath the well or wells, which low density droplets then float upwards into the well or wells when the droplets are (via fluid flow) in register with the well or wells. The photoresponsive layer can be illuminated, which illumination can be applied so as to rupture the photoresponsive layer so as to allow the droplets to exit their respective wells by way of the rupture(s) in the photoresponsive layer and enter a channel disposed above the photoresponsive layer. Alternatively, the photoresponsive layer can be illuminated so as to effect local heating, which local heating in turn gives rise to bubble formation in the wells, which bubbles in turn force the droplets out of the bottom openings of the well or wells into a channel (e.g., the trap chamber or trap channel shown in FIG. 2) for collection. As described elsewhere herein, collection can be performed in an automated fashion, with released droplets being guided into collection vesicles or other collection vessels. Such vesicles or vessels can be indexed.

Alternatively, a device can be arranged such that the photoresponsive layer is arranged below a well, i.e., so as to cover the lower opening of a well. In such an arrangement, a droplet that is denser than a continuous phase in which the droplet is disposed can be communicated through a channel above the well such that the relatively dense droplet falls into the well when the droplet is in register with the well. Upon rupture of the photoresponsive layer, the droplet can exit the well downwards (through the rupture formed in the photoresponsive layer) and enter a channel below the well. Alternatively, the photoresponsive layer can be illuminated so as to effect local heating at a well or wells, which local heating in turn gives rise to bubble formation in the well or wells, which bubble formation in turn forces the droplets out of the upper openings of the well or wells into a channel that is above the well or wells (e.g., the channel that first delivered the droplets to the well or wells) for collection.

It should be understood that a device can be operated such that each droplet comprises a cell that has already been treated by one or more agents, e.g., therapeutics. A device can also be operated such that each droplet comprises an untreated cell, and when the droplet is positioned in a well, an agent or agents are introduced to the droplet so as to interact the agent or agents with the cell or cells of the droplet.

Aspect 8. The microfluidic device of Aspect 7, wherein the first channel is formed in a monolithic first channel substrate.

Aspect 9. The microfluidic device of any one of Aspects 1 to 8, wherein the well substrate is characterized as monolithic.

Aspect 10. The microfluidic device of any one of Aspects 1 to 9, wherein (a) the photoresponsive layer is essentially optically transparent, (b) the photoresponsive layer exhibits absorption for illumination having a wavelength of from about 750 to about 1400 nm, (c) the photoresponsive layer has a glass transition temperature of from about 35° C. to about 100° C., or any combination of (a), (b), or (c). Glass transition temperatures of from about 35° C. to about 50° C. are considered especially suitable, but such temperatures are not a requirement, and the glass transition temperature of the photoresponsive layer can be selected according to the needs of the user.

Aspect 11. The microfluidic device of any one of Aspects 1 to 10, wherein the photoresponsive layer comprises one or more of a dye and a plasticizer. A photoresponsive layer can also include, e.g., functional molecules on its surface such as oligonucleotides, antibodies, caged small molecules, and the like. Likewise, a well can have on its surface functional molecules on its surface such as oligonucleotides, antibodies, caged small molecules, and the like.

Aspect 12. The microfluidic device of any one of Aspects 1 to 11, wherein (a) the plurality of wells is present at a density of greater than about 7,000 wells per $cm^2$, (b) the device comprises at least 40,000 wells, or both (a) and (b).

Aspect 13. The microfluidic device of any one of Aspects 1 to 12, wherein a first well and a second well of the plurality of wells comprise different contents.

Aspect 14. The microfluidic device of any one of Aspects 1 to 13, wherein a well defines (a) a width of from about 1 μm to about 1000 μm, (b) a depth of from about 1 μm to about 1000 μm, (c) a volume in the range of from about 0.5 to about 1.5 pL, or any combination of (a), (b), and (c). As an example, a well can have a width of from about 1 μm to about 1000 μm, or from about 10 μm to about 100 μm. As an example, a well can have a depth of from about 1 μm to about 1000 μm, or from about 10 μm to about 100 μm.

Aspect 15. A system, comprising:
a microfluidic device according to any one of Aspects 1 to 14;
an illumination train, the illumination train configured to illuminate a portion of the photoresponsive layer that overlies a well,
the illumination train being configured to deliver illumination so as to (a) rupture the portion of the photoresponsive layer that overlies the well, (b) effect heating proximate to or within the well sufficient to give rise to sufficient bubble formation within the well to expel contents of the well from the second opening of the well, or both (a) and (b).

Aspect 16. The system of Aspect 15, wherein the illumination train is configured to address individual wells.

Aspect 17. The system of any one of Aspects 15 to 16, wherein the illumination train is configured to deliver illumination having a wavelength of from about 750 to about 1400 nm to the portion of the photoresponsive layer that overlies the well.

Aspect 18. The system of any of Aspects 15 to 17, further comprising a monitoring train, the monitoring train being configured to (a) collect spectral data from one or more wells, (b) collect one or more images of one or more wells, or both (a) and (b). As but one example, the monitoring train can be configured to collect time lapse data and/or images of a given well.

Aspect 19. The system of any one of Aspects 15 to 18, wherein the monitoring train is configured to address individual wells.

It should also be understood that a system according to the present disclosure can include one or more elements that co-encapsulates cells with selected reagents in a droplet reaction chamber and/or in a well.

Aspect 20. A method, comprising:
(a) illuminating a region of a photoresponsive layer that seals a first opening of a well defined in a substrate so as to degrade the region of photoresponsive layer and form an aperture in the photoresponsive layer through which aperture a sample located within the well exits the well;
(b) illuminating a region of a photoresponsive layer proximate to a well defined in a substrate, the photoresponsive layer optionally sealing a first opening of the well, so as to effect heating proximate to or within the well sufficient to give rise to sufficient bubble formation within the well to expel contents of the well from a second opening of the well, or
both (a) and (b).

Aspect 21. The method of Aspect 20, wherein the illuminating comprises delivering illumination having a wavelength of from about 750 to about 1400 nm.

Aspect 22. The method of any one of Aspects 20 to 21, further comprising (a) collecting spectral data from one or more wells of the substrate, (b) collecting an image of one or more wells of the substrate, or both (a) and (b).

Aspect 23. The method of any one of Aspects 20 to 22, wherein the illuminating is of a sample within the well meeting one or more observed criteria.

Aspect 24. The method of any one of Aspects 20 to 23, wherein the well comprises a single-cell sample. A well can, of course, comprise a sample that comprises a plurality of cells.

Aspect 25. The method of any one of Aspects 20 to 24, wherein (a) the substrate defines at least 40,000 wells, (b) the substrate defines wells present of at least 7,000 wells/$cm^2$, or both (a) and (b).

Aspect 26. The method of Aspect 20, further comprising collecting a collected sample that comprises sample that exits or is expelled from the well.

Aspect 27. The method of Aspect 26, further comprising directing the collected sample to a collection vessel.

Aspect 28. The method of Aspect 27, wherein the directing is performed in an automated fashion.

Aspect 29. The method of Aspect 27, wherein the directing comprises directing collected sample to a plurality of collection vessels.

Aspect 30. The method of Aspect 27, wherein the directing is performed based on the collected sample meeting one or more criteria.

Aspect 31. The method of Aspect 30, wherein a criterion comprises an optically-measured characteristic. Such a characteristics can include, e.g., a fluorescence, a turbidity, and the like. A criterion can also be an electrically-measured characteristics, e.g., resistance/conductivity, current, voltage, and the like.

Aspect 32. A method, comprising:
interrogating one or more of a population of cells disposed in a plurality of wells,
each well being sealed by a photoresponsive layer,
at least some of the wells being occupied by single cells, and
the interrogating being spectroscopic interrogation or visual interrogation; and
for one or more cells exhibiting a selected characteristic detectable by the interrogating, illuminating the photoresponsive layer so as to (a) form an aperture in the portion of the photoresponsive layer that overlies the well and recovering the cell following the cell's exit from the aperture, (b) effect heating proximate to or within the well sufficient to give rise to bubble formation within the well that expels the cell from an opening of the well and recovering the cell.

The results of the interrogating can be collected over time and reviewed and/or analyzed following the collection of the results. Alternatively, the results of the interrogating can be collected and/or processed in real time.

Aspect 33. The method of Aspect 32, wherein cells of the population of cells differ from one another in origin.

Aspect 34. The method of any one of Aspects 32 to 33, wherein cells of the population of cells differ from one another in one or more treatments to which the cells have been subjected.

Aspect 35. The method of Aspect 34, wherein the treatments are therapies.

Aspect 36. The method of any one of Aspects 32 to 35, wherein a characteristic comprises a phenotype, a genotype, a molecular structure, a metabolic characteristic, or any combination thereof.

REFERENCES

Further information related to the disclosed technology is found in Biomicrofluidics 14, 051302 (2020) and ACS Appl. Mater. Interfaces, 2020, 12, 3, 3936-3944 (2020), both of which are incorporated herein by reference in their entireties for any and all purposes.

The following is a list of additional references, which references are also incorporated herein by reference in their entireties for any and all purposes.

(1) Dittrich, P. S.; Manz, A. Lab-on-a-Chip: Microfluidics in Drug Discovery. Nat. Rev. Drug Discov. 2006, 5 (3), 210-218. https://doi.org/10.1038/nrd1985.

(2) Zhou, Y.; Basu, S.; Wohlfahrt, K. J.; Lee, S. F.; Klenerman, D.; Laue, E. D.; Seshia, A. A. A Microfluidic Platform for Trapping, Releasing and Super-Resolution Imaging of Single Cells. Sens. Actuators. B. Chem. 2016, 232, 680-691. https://doi.org/10.1016/j.snb.2016.03.131.

(3) Pompano, R. R.; Liu, W.; Du, W.; Ismagilov, R. F. Microfluidics Using Spatially Defined Arrays of Droplets in One, Two, and Three Dimensions. Annu. Rev. Anal. Chem. 2011, 4 (1), 59-81. https://doi.org/10.1146/annurev.anchem.012809.102303.

(4) Huang, N.-T.; Hwong, Y.-J.; Lai, R. L. A Microfluidic Microwell Device for Immunomagnetic Single-Cell Trapping. Microfluid. Nanofluidics 2018, 22 (2), 16. https://doi.org/10.1007/s10404-018-2040-x.

(5) Agresti, J. J.; Antipov, E.; Abate, A. R.; Ahn, K.; Rowat, A. C.; Baret, J.-C.; Marquez, M.; Klibanov, A. M.; Griffiths, A. D.; Weitz, D. A. Ultrahigh-Throughput Screening in Drop-Based Microfluidics for Directed Evolution. Proc. Natl. Acad. Sci. U.S.A. 2010, 107 (9), 4004-4009. https://doi.org/10.1073/pnas.0910781107.

(6) Fallah-Araghi, A.; Baret, J. C.; Ryckelynck, M.; Griffiths, A. D. A Completely in Vitro Ultrahigh-Throughput Droplet-Based Microfluidic Screening System for Protein Engineering and Directed Evolution. Lab Chip 2012, 12 (5), 882-891. https://doi.org/10.1039/c2lc21035e.

(7) Guo, M. T.; Rotem, A.; Heyman, J. A.; Weitz, D. A. Droplet Microfluidics for High-Throughput Biological Assays. Lab Chip 2012, 12 (12), 2146-2155. https://doi.org/10.1039/c2lc21147e.

(8) Huebner, A.; Bratton, D.; Whyte, G.; Yang, M.; Demello, A. J.; Abell, C.; Hollfelder, F. Static Microdroplet Arrays: A Microfluidic Device for Droplet Trapping, Incubation and Release for Enzymatic and Cell-Based Assays. Lab Chip 2009, 9 (5), 692-698. https://doi.org/10.1039/b813709a.

(9) Sun, M.; Bithi, S. S.; Vanapalli, S. A. Microfluidic Static Droplet Arrays with Tuneable Gradients in Material Composition. Lab Chip 2011, 11 (23), 3949. https://doi.org/10.1039/c1lc20709a.

(10) Jeong, H.-H.; Lee, B.; Jin, S. H.; Jeong, S.-G.; Lee, C.-S. A Highly Addressable Static Droplet Array Enabling Digital Control of a Single Droplet at Pico-Volume Resolution. Lab Chip 2016, 16 (9), 1698-1707. https://doi.org/10.1039/C6LC00212A.

(11) Rousset, N.; Monet, F.; Gervais, T. Simulation-Assisted Design of Microfluidic Sample Traps for Optimal Trapping and Culture of Non-Adherent Single Cells, Tissues, and Spheroids. 2017, No. February, 1-12. https://doi.org/10.1038/s41598-017-00229-1.

(12) Wang, H.-Y.; Bao, N.; Lu, C. A Microfluidic Cell Array with Individually Addressable Culture Chambers. Biosens. Bioelectron. 2008, 24 (4), 613-617. https://doi.org/10.1016/J.BIOS.2008.06.005.

(13) Iwai, K.; Tan, W.-H.; Ishihara, H.; Takeuchi, S. A Resettable Dynamic Microarray Device. https://doi.org/10.1007/s10544-011-9578-7.

(14) Tan, W.-H.; Takeuchi, S. A Trap-and-Release Integrated Microfluidic System for Dynamic Microarray Applications; 2007.

(15) Leung, K.; Zahn, H.; Leaver, T.; Konwar, K. M.; Hanson, N. W.; Pagé, A. P.; Lo, C.-C.; Chain, P. S.; Hallam, S. J.; Hansen, C. L.; et al. A Programmable Droplet-Based Microfluidic Device Applied to Multiparameter Analysis of Single Microbes and Microbial Communities. https://doi.org/10.1073/pnas.1106752109/-/DCSupplemental.

(16) Wang, W.; Yang, C.; Liu, Y.; Li, C. M. On-Demand Droplet Release for Droplet-Based Microfluidic System †. Lab Chip 2010, 10, 559-562. https://doi.org/10.1039/b924929j.

(17) Park, J.; Jung, J. H.; Park, K.; Destgeer, G.; Ahmed, H.; Ahmad, R.; Sung, H. J. On-Demand Acoustic Droplet Splitting and Steering in a Disposable Microfluidic Chip. Lab Chip 2018, 18 (3), 422-432. https://doi.org/10.1039/c7lc01083d.

(18) Padmanabhan, S.; Misteli, T.; DeVoe, D. L. Controlled Droplet Discretization and Manipulation Using Membrane Displacement Traps. Lab Chip 2017, 17 (21), 3717-3724. https://doi.org/10.1039/C7LC00910K.

(19) Rambach, R. W.; Biswas, P.; Yadav, A.; Garstecki, P.; Franke, T. Fast Selective Trapping and Release of Picoliter Droplets in a 3D Microfluidic PDMS Multi-Trap System with Bubbles. Analyst 2018, 143 (4), 843-849. https://doi.org/10.1039/C7AN01100H.

(20) Labanieh, L.; Nguyen, T.; Zhao, W.; Kang, D.-K.; Labanieh, L.; Nguyen, T. N.; Zhao, W.; Kang, D.-K. Floating Droplet Array: An Ultrahigh-Throughput Device for Droplet Trapping, Real-Time Analysis and Recovery. Micromachines 2015, 6 (10), 1469-1482. https://doi.org/10.3390/mi6101431.

(21) Schmitz, C. H. J.; Rowat, A. C.; Köster, S.; Weitz, D. A. Dropspots: A Picoliter Array in a Microfluidic Device. Lab Chip 2009, 9 (1), 44-49. https://doi.org/10.1039/B809670H.

(22) Melin, J.; Quake, S. R. Microfluidic Large-Scale Integration: The Evolution of Design Rules for Biological Automation. Annu. Rev. Biophys. Biomol. Struct. 2007, 36 (1), 213-231. https://doi.org/10.1146/annurev.biophys.36.040306.132646.

(23) Segaliny, A. I.; Li, G.; Kong, L.; Ren, C.; Chen, X.; Wang, J. K.; Baltimore, D.; Wu, G.; Zhao, W. Functional TCR T Cell Screening Using Single-Cell Droplet Microfluidics. Lab Chip 2018, 18 (24), 3733-3749. https://doi.org/10.1039/C8LC00818C.

(24) Polystyrene https://polymerdatabase.com/polymers/polystyrene.html (accessed Jun. 6, 2019).

(25) Csernica, J.; Brown, A. Effect of Plasticizers on the Properties of Polystyrene Films W. 1999, 76 (11), 9-11. https://doi.org/10.1021/ed076p1526.

(26) Kim, H. S.; Devarenne, T. P.; Han, A. From Chip-in-a-Lab to Lab-on-a-Chip: Towards a Single Handheld Electronic System for Multiple Application-Specific Lab-on-a-Chip (ASLOC). 2014, 15, 2467. https://doi.org/10.1039/c4lc01316f.

(27) Utharala, R.; Tseng, Q.; Furlong, E. E. M.; Merten, C. A. A Versatile, Low-Cost, Multiway Microfluidic Sorter for Droplets, Cells, and Embryos. 2018. https://doi.org/10.1021/acs.analchem.7b04689.

(28) Juul, S.; Ho, Y. P.; Koch, J.; Andersen, F. F.; Stougaard, M.; Leong, K. W.; Knudsen, B. R. Detection of Single Enzymatic Events in Rare or Single Cells Using Microfluidics. ACS Nano 2011, 5 (10), 8305-8310. https://doi.org/10.1021/nn203012q.

(29) Jeong, H.-H.; Han, S. H.; Yadavali, S.; Kim, J.; Issadore, D.; Lee, D. Moldable Perfluoropolyether-Polyethylene Glycol Networks with Tunable Wettability and Solvent Resistance for Rapid Prototyping of Droplet Microfluidics. Chem. Mater. 2018, 30 (8). https://doi.org/10.1021/acs.chemmater.7b05043.

(30) Kang, D.-K.; Monsur Ali, M.; Zhang, K.; Pone, E. J.; Zhao, W. Droplet Microfluidics for Single-Molecule and Single-Cell Analysis in Cancer Research, Diagnosis and Therapy. TrAC Trends Anal. Chem. 2014, 58, 145-153. https://doi.org/10.1016/j.trac.2014.03.006.

(31) Kirchherr, A.-K.; Briel, A.; Mäder, K. Stabilization of Indocyanine Green by Encapsulation within Micellar Systems. Mol. Pharm. 2009, 6 (2), 480-491. https://doi.org/10.1021/mp8001649.

(32) Venkatesh, R. B.; Han, S. H.; Lee, D. Patterning Polymer-Filled Nanoparticle Films via Leaching-Enabled Capillary Rise Infiltration (LeCaRI). Nanoscale Horizons 2019. https://doi.org/10.1039/c9nh00130a.

(33) Azhdarinia, A.; Wilganowski, N.; Robinson, H.; Ghosh, P.; Kwon, S.; Lazard, Z. W.; Davis, A. R.; Olmsted-Davis, E.; Sevick-Muraca, E. M. Characterization of Chemical, Radiochemical and Optical Properties of a Dual-Labeled MMP-9 Targeting Peptide. Bioorg. Med. Chem. 2011, 19 (12), 3769-3776. https://doi.org/10.1016/j.bmc.2011.04.054.

What is claimed:

1. A microfluidic device comprising:
   a well substrate having a plurality of wells defined in the well substrate, each well of the plurality of wells having a first opening and a second opening;
   a photoresponsive layer sealing the first opening of each well of the plurality of wells; and
   a trap channel in fluidic communication with the second opening of each well of the plurality of wells.

2. The microfluidic device of claim 1 further comprising a collection device configured to guide a droplet from a well of the plurality of wells to a collection vessel.

3. The microfluidic device of claim 2 wherein the collection device is configured to operate in an automated manner.

4. The microfluidic device of claim 2 wherein the collection device comprises a pump, a valve, a conduit, or a combination thereof.

5. The microfluidic device of claim 2 further comprising the collection vessel capable of fluidically communicating with the collection device.

6. The microfluidic device of claim 2 wherein the collection device is configured to operate between a first state and a second state, wherein the first state defines a first flow path for the droplet and the second state define a second flow path for the droplet.

7. The microfluidic device of claim 1 further comprising a first channel and wherein the photoresponsive layer prevents the first channel from fluidically communicating with the first opening of one or more wells of the plurality of wells.

8. The microfluidic device of claim 7 further comprising a monolithic first channel substrate comprising the first channel formed in the monolithic first channel substrate.

9. The microfluidic device of claim 1 wherein the well substrate is a monolithic well substrate.

10. The microfluidic device of claim 1 wherein (a) the photoresponsive layer is essentially optically transparent, or (b) the photoresponsive layer exhibits a light absorption for light having a wavelength between about 750 nm and about 1400 nm, or (c) the photoresponsive layer has a glass transition temperature between about 35° C. and about 100° C., or a combination thereof.

11. The microfluidic device of claim 1 wherein the photoresponsive layer comprises a dye or a plasticizer or both.

12. The microfluidic device of claim 1 wherein (a) the plurality of wells is provided with a density of greater than 7,000 wells per $cm^2$, or (b) the plurality of wells comprises at least 40,000 wells, or both (a) and (b).

13. The microfluidic device of claim 1 wherein the plurality of well has a first well for containing a first content and a second well for containing a second content.

14. The microfluidic device of claim 1 wherein one or more wells of the plurality of well has a (a) width between about 1 μm and about 1000 μm, or (b) a depth from between about 1 μm and about 1000 μm, or (c) a volume between about 0.5 pL and about 1.5 pL, or a combination of thereof.

15. A system comprising:
   the microfluidic device of claim 1;
   an illumination train configured to illuminate a particular portion of the photoresponsive layer overlying a particular well of the plurality of wells, so as to:
   (a) rupture the particular portion of the photoresponsive layer overlying the particular well, or
   (b) expel contents in the particular well through the second opening of the particular well by forming a bubble within the particular well by heating the particular well or a region proximate to the particular well or both (a) and (b).

16. The system of claim 15, wherein the illumination train is configured to illuminate individually each well of the plurality of wells.

17. The system of claim 15, wherein the illumination train is configured to illuminate with light having a wavelength between about 750 nm and about 1400 nm the portion of the photoresponsive layer overlying the particular well.

18. The system of claim 15 further comprising a monitoring train configured to (c) collect spectral data from one or more wells of the plurality of wells, or (d) collect one or more images of one or more wells of the plurality of well, or both (c) and (d).

19. The system of claim 18, wherein the monitoring train is configured to illuminate individually each well of the plurality of wells.

* * * * *